(12) United States Patent
Ishiwaki

(10) Patent No.: US 6,407,597 B1
(45) Date of Patent: Jun. 18, 2002

(54) SEMICONDUCTOR DEVICE CAPABLE OF IMMEDIATELY RECOVERING FROM ERRONEOUS STATE TO NORMAL STATE

(75) Inventor: Masahiko Ishiwaki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/880,123

(22) Filed: Jun. 14, 2001

(30) Foreign Application Priority Data

Dec. 8, 2000 (JP) ........................................ 2000-374000

(51) Int. Cl.⁷ .............................................. H03L 7/00
(52) U.S. Cl. ........................ 327/142; 327/198; 377/106; 377/107
(58) Field of Search ................................ 327/142, 143, 327/198; 377/46, 106, 107, 124, 28; 710/58, 61

(56) References Cited

U.S. PATENT DOCUMENTS

| | | | | |
|---|---|---|---|---|
| 3,586,982 A | * | 6/1971 | Hoyler | ........................ 377/107 |
| 3,639,740 A | * | 2/1972 | Escoffier et al. | ............... 377/28 |
| 4,630,295 A | * | 12/1986 | Kamuro et al. | ................ 377/81 |
| 5,867,409 A | * | 2/1999 | Nozuyama | .................... 377/72 |
| 6,091,794 A | * | 7/2000 | Rogers | ........................ 377/116 |

FOREIGN PATENT DOCUMENTS

JP   2-181518   7/1990

* cited by examiner

*Primary Examiner*—Terry D. Cunningham
*Assistant Examiner*—An T. Luu
(74) *Attorney, Agent, or Firm*—McDermott, Will & Emery

(57) ABSTRACT

A reset circuit outputting a reset signal /RESET when detecting an abnormal state in a ring counter is provided. The reset circuit divides the outputs of flip-flops constituting the ring counter into two groups, and check if either of the groups has "H" data. When "H" data exists in both of the two groups or when "H" data does not exist in either of the two groups, the reset circuit activates the reset signal /RESET to L level. Therefore, a semiconductor device can detect an erroneous state and recover to a normal state quickly.

9 Claims, 9 Drawing Sheets

SEMICONDUCTOR DEVICE CAPABLE OF IMMEDIATELY RECOVERING FROM ERRONEOUS STATE TO NORMAL STATE

BACKGROUND OF THE INVENTION

1. Field of the Invention

The present invention relates to a semiconductor device, and more particularly to a semiconductor device including a counter circuit.

2. Description of the Background Art

A semiconductor device operating in synchronization with an externally applied clock contains, in many cases, a counter circuit for frequency-dividing the applied external clock. There are various kinds of counters. The most common one is a binary counter which can represent the state of two to n-th power with n latches. A binary counter is such a counter in that outputs of n latches correspond to respective bits, which respectively correspond to $2^0$ to $2^n$.

In a binary counter, however, operational frequency is limited, since critical path exists from the establishment of lower bits to the establishment of upper bits. Further, in such an application in that pulse signals are output at every certain period, output of each bit needs to be decoded by an AND circuit to be used. A pulse signal generated by such decoding must be once received by D flip-flop, in order to use the signal as an internal clock signal serving as a reference of operation.

Recently, as the speed of operation of a semiconductor device has increased, in some cases, an external clock is multiplied internally to generate a faster internal clock so that an operation is performed in synchronization therewith. In an application that requires such a high-speed operation, a ring counter which can operate faster than a binary counter may be used. A ring counter is used as a frequency divider of the clock or for creating a timing signal serving as an operational reference of an internal circuit.

A ring counter is a counter in which bistable units such as flip-flops are connected in a loop. At any given time, only one flip-flop holds "H" (high) data while the remaining flip-flops hold "L" (low) data. Each time clock signal is counted, the position of the flip-flop holding "H" data successively circulates around the loop.

FIG. 8 is a block diagram showing a schematic configuration of a conventional semiconductor device 452.

Referring to FIG. 8, semiconductor device 452 includes: an internal clock generating circuit 454 receiving an externally applied clock signal CLK and a reset signal /RESET and outputting an internal clock signal at a frequency n-times that of external clock signal CLK; and an internal circuit 456 receiving an externally applied input signal DIN, operating in synchronization with internal clock signal ICLK and outputting an output signal DOUT to the external.

Internal clock generating circuit 454 includes: a PLL (Phase Locked Loop) circuit 458 receiving a clock signal CLK and outputting internal clock signal ICLK; and a ring counter 500 starting an operation after initialized by externally applied reset signal /RESET and frequency-dividing internal clock signal ICLK to output an internal clock signal RCLK. Internal clock signal RCLK has a frequency that is one-nth of clock signal ICLK. Internal clock signal RCLK is compared in phase with externally applied clock signal CLK by PLL circuit 458.

FIG. 9 is a circuit diagram showing a configuration of ring counter 500 shown in FIG. 8.

Referring to FIG. 9, ring counter 500 includes a gate circuit 502#1 receiving internal clock signal RCLK and reset signal /RESET.

Gate circuit 502#1 has its output driven to H level when reset signal /RESET is activated to L level, and driven to H level when internal clock signal RCLK is set to H level.

Ring counter 500 further includes: a D flip-flop 504#1 receiving an output of gate circuit 502#1 in synchronization with internal clock signal ICLK; an AND circuit 502#2 receiving an output of D flip-flop 504#1 and reset signal /RESET; and a D flip-flop 504#2 receiving an output of AND circuit 502#2 in synchronization with internal clock signal ICLK.

Ring counter 500 further includes: an AND circuit 502#3 receiving an output of D flip-flop 504#2 and reset signal /RESET; a D flip-flop 504#3 receiving an output of AND circuit 502#3 in synchronization with internal clock signal ICLK; an AND circuit 502#4 receiving an output of D flip-flop 504#3 and reset signal /RESET; and a D flip-flop 504#4 receiving an output of AND circuit 502#4 in synchronization with internal clock signal ICLK.

Ring counter 500 further includes: an AND circuit 502#5 receiving an output of D flip-flop 504#4 and reset signal /RESET; a D flip-flop 504#5 receiving an output of AND circuit 502#5 in synchronization with internal clock signal ICLK; an AND circuit 502#6 receiving an output of D flip-flop 504#5 and reset signal /RESET; and a D flip-flop 504#6 receiving an output of AND circuit 502#6 in synchronization with internal clock signal ICLK.

Ring counter 500 further includes: an AND circuit 502#7 receiving an output of D flip-flop 504#6 and reset signal /RESET; a D flip-flop 504#7 receiving an output of AND circuit 502#7 in synchronization with internal clock signal ICLK; an AND circuit 502#8 receiving an output of D flip-flop 504#7 and reset signal /RESET; and a D flip-flop 504#8 receiving an output of AND circuit 502#8 in synchronization with internal clock signal ICLK.

An output of D flip-flop 504#8 is provided to PLL circuit 458 in FIG. 8 as internal clock signal RCLK, and compared in phase with clock signal CLK.

FIG. 10 is an operational waveform diagram illustrating an operation of ring counter 500 shown in FIG. 9.

Referring to FIGS. 9 and 10, Q1–Q8 are output signals of D flip-flops 504#1–504#8, respectively. Firstly, in clock cycle #1, signal Q1 is at H level and signals Q2–Q8 are at L level. Then, in clock cycle #2, signal Q1 falls to L level in response to a rise of internal clock signal ICLK and instead of signal Q1, signal Q2 rises to H level. Signals Q3–Q8 remain at the state of L level.

Afterwards, at every rising edge of the clock signal, the flip-flop outputting H level shifts to the latter stage one by one. When clock cycle #8 terminates, again in clock cycle #9, signal Q1 is returned to be at H level and signals Q2–Q8 to be at L level. Such a ring counter in that shift registers are connected in a ring enables a high-speed operation, and in addition, the output signal of flip-flop 504#8 can be directly used as a timing reference signal.

As explained above, among flip-flops constituting a shift register, only one flip-flop holds H data which is transmitted to the next stage every time internal clock signal ICLK is input. Therefore, when internal clock signal ICLK corresponding to the number of flip-flops. is received, a reference pulse signal can be obtained which has a period corresponding to the number of flip-flops in one clock width as internal clock signal RCLK. By changing the number of flip-flops, in such a ring counter, the period of output signal can be changed easily.

However, ring counter as such has a problem, that is, once an error occurs, it cannot recover from the error until a reset signal is input again.

FIG. 11 is a waveform diagram illustrating an error of a conventional ring counter.

Referring to FIGS. 9 and 11, signals Q1–Q8 show outputs signals of D flip-flops 504#1–504#8, respectively.

In clock cycles #1–#4, the position of D flip-flop outputting H level successively is shifting in order, similar to the operation explained with respect to FIG. 10.

In clock cycle #5, the output node of D flip-flop 504#1 suffers noise of H level caused, for example, by radiation and the like and that noise may be held.

Then, in clock cycle #6, H data due to the noise is shifted to the next stage, resulting in signal Q2 driven to H level. Therefore, after clock cycle #6, two flip-flops out of eight hold H level data.

For example, in clock cycle #8, signals Q4 and Q8 are brought to be at H level. Thus, after clock cycle #8, internal clock signal RCLK output from ring counter 500 comes to have a frequency twice that of the original one. As a result, PLL circuit 458 in FIG. 8 causes an error in which it generates a clock signal with the frequency reduced to one half that of an internal clock signal to be generated.

More specifically, though ring counter 500 shown in FIG. 9 can represent the states in only eight ways in normal operation, it can represent the states in 256 ways as a combination. Therefore, there arises a problem in which when the ring counter goes into any of the states of the combination in 248 ways as the abnormal state, it cannot recover to its normal operation. For example, in such an application that is continuously run for a long time and cannot be initialized by power-on, such as a workstation operating all night, an air-conditioner for controlling the temperature in a plant, a security system, a internet server and the like, the occurrence of such an error results in a big problem.

SUMMARY OF THE INVENTION

An object of the present invention is to provide a reliable semiconductor device which is able to recover to a normal state immediately even if an error occurs.

The present invention, in summary, provides a semiconductor device including a plurality of holding circuits and a reset circuit.

The plurality of holding circuits are connected in series in a ring, each receives data in synchronization with a clock signal and transmits it to the next stage. The reset circuit monitors hold data in the plurality of holding circuits, and when detecting an abnormal state, initializes the hold data. The reset circuit initializes the hold data when data of a first logical value exists in a first portion of the plurality of holding circuits and data of the first logical value exists in a second portion excluding the first portion of the plurality of holding circuits, or when data of the first logical value does not exist in the first portion of the plurality of holding circuits and data of the first logical value does not exist in the second portion excluding the first portion of the plurality of holding circuits.

According to another aspect of the present invention, the present invention provides a semiconductor device including a plurality of holding circuits and a reset circuit.

The plurality of holding circuits are connected in series in a ring, each receives data in synchronization with a clock signal and transmits it to the next stage. The reset circuit monitors hold data in the plurality of holding circuits, and when detecting an abnormal state, initializes the hold data. The reset circuit includes: a plurality of decode circuits detecting a plurality of states, respectively, which the plurality of holding circuits may take in a normal operational state; and an output circuit outputting a reset signal for initializing the hold data when none of outputs of the plurality of decode circuits are activated.

Therefore, a main advantage of the present invention is that it enhances an operational reliability because of the capability to recover from an erroneous state to the normal operational state even when an error is caused by noise of radiation and the like.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
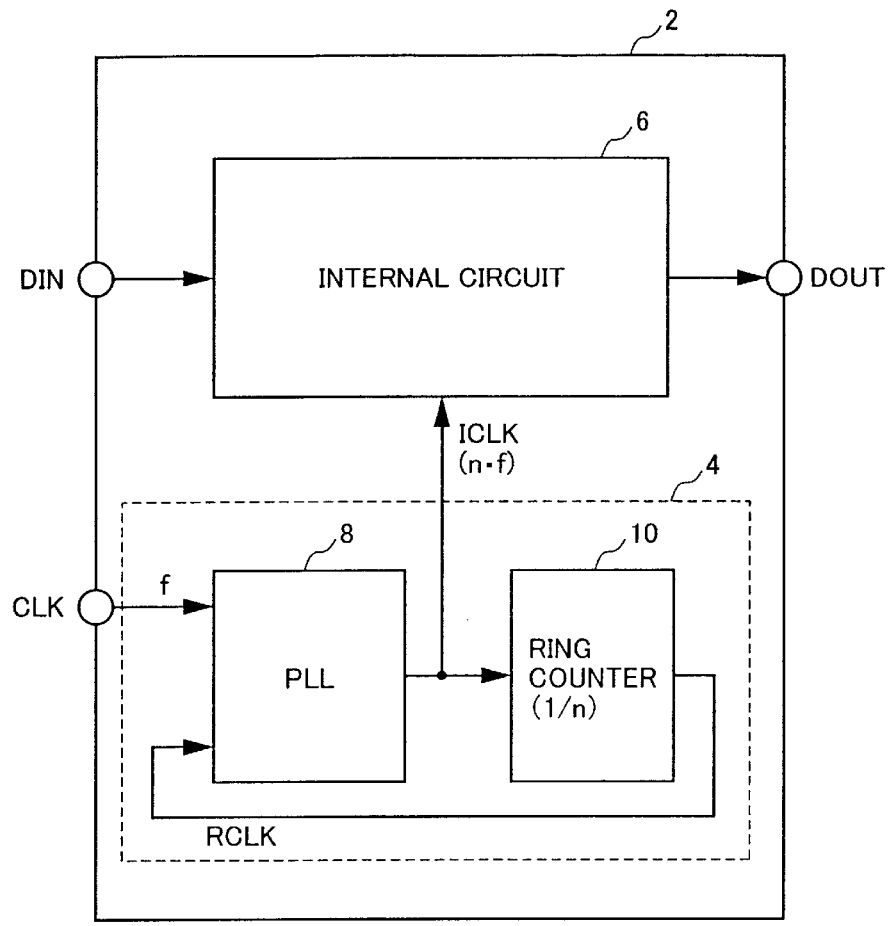
FIG. 1 is a schematic block diagram showing a configuration of a semiconductor device 2 in accordance with a first embodiment of the present invention.

In the following, embodiments of the present invention will be described in detail with reference to the figures. In the figures, the same reference characters denote the same or corresponding portions.

First Embodiment

FIG. 1 is a schematic block diagram showing a configuration of a semiconductor device 2 in accordance with the first embodiment of the present invention.

Referring to FIG. 1, semiconductor device 2 includes: an internal clock generating circuit 4 receiving an externally applied clock signal CLK and outputting an internal clock signal ICLK having a frequency n-times that of the external clock signal CLK; and an internal circuit 6 receiving an externally applied input signal DIN, performing an operation in synchronization with internal clock signal ICLK and externally outputting an output signal DOUT.

Internal clock generating circuit 4 includes: a PLL (Phase Locked Loop) circuit 8 receiving clock signal CLK and outputting internal clock signal ICLK; and a ring counter 10 determining if an initial value is in normal state when powered, starting an operation after initializing data if it is not the normal state, and frequency-dividing internal clock signal ICLK to output an internal clock signal RCLK. Internal clock signal RCLK has a frequency one n-th that of clock signal ICLK. Internal clock signal RCLK is compared in phase with externally applied dock signal CLK by PLL circuit 8.

Figure 2:
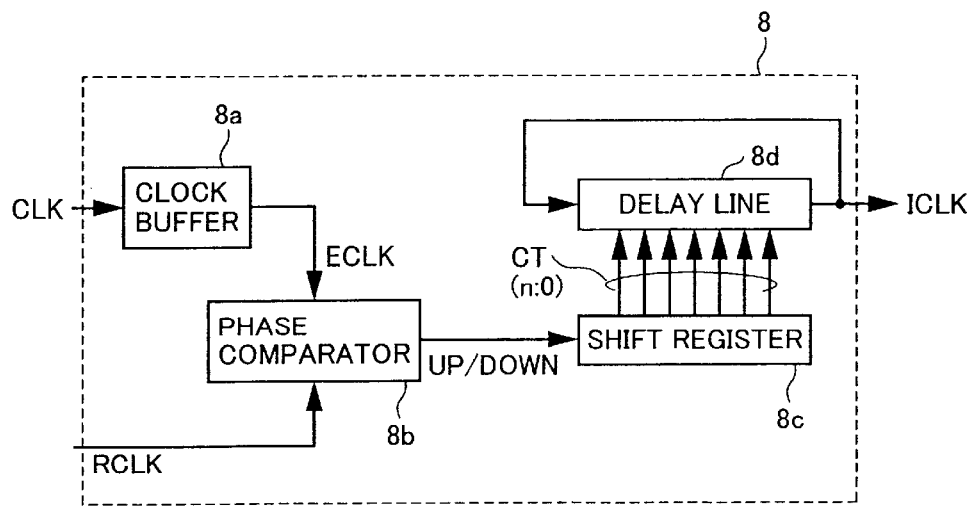
FIG. 2 is a block diagram showing a configuration of a PLL circuit 8 shown in FIG. 1.

FIG. 2 is a block diagram showing a configuration of the PLL circuit 8 in FIG. 1.

Referring to FIG. 2, PLL circuit 8 includes: a clock buffer 8a receiving clock signal CLK and outputting an internal clock signal ECLK; a phase comparator 8b comparing a phase of internal clock signal RCLK with a phase of internal clock signal ECLK and outputting control signals UP/DOWN; a shift register 8c shifting an active bit of a control signal CT (n:0) toward upper direction in response to control signal UP as well as shifting an active bit of control signal CT (n:0) toward lower direction in response to control signal DOWN; and a delay line 8d having an amount of delay changed in response to control signal CT (n:0). Delay line 8d is configured with inverting circuits of an odd number of stages, and the number of the delay stages changes by two in response to control signal CT (n:0). Delay line 8d outputs internal clock signal ICLK which is also input to delay line 8d, so that delay line 8d operates as a self-exciting ring oscillator.

Figure 3:
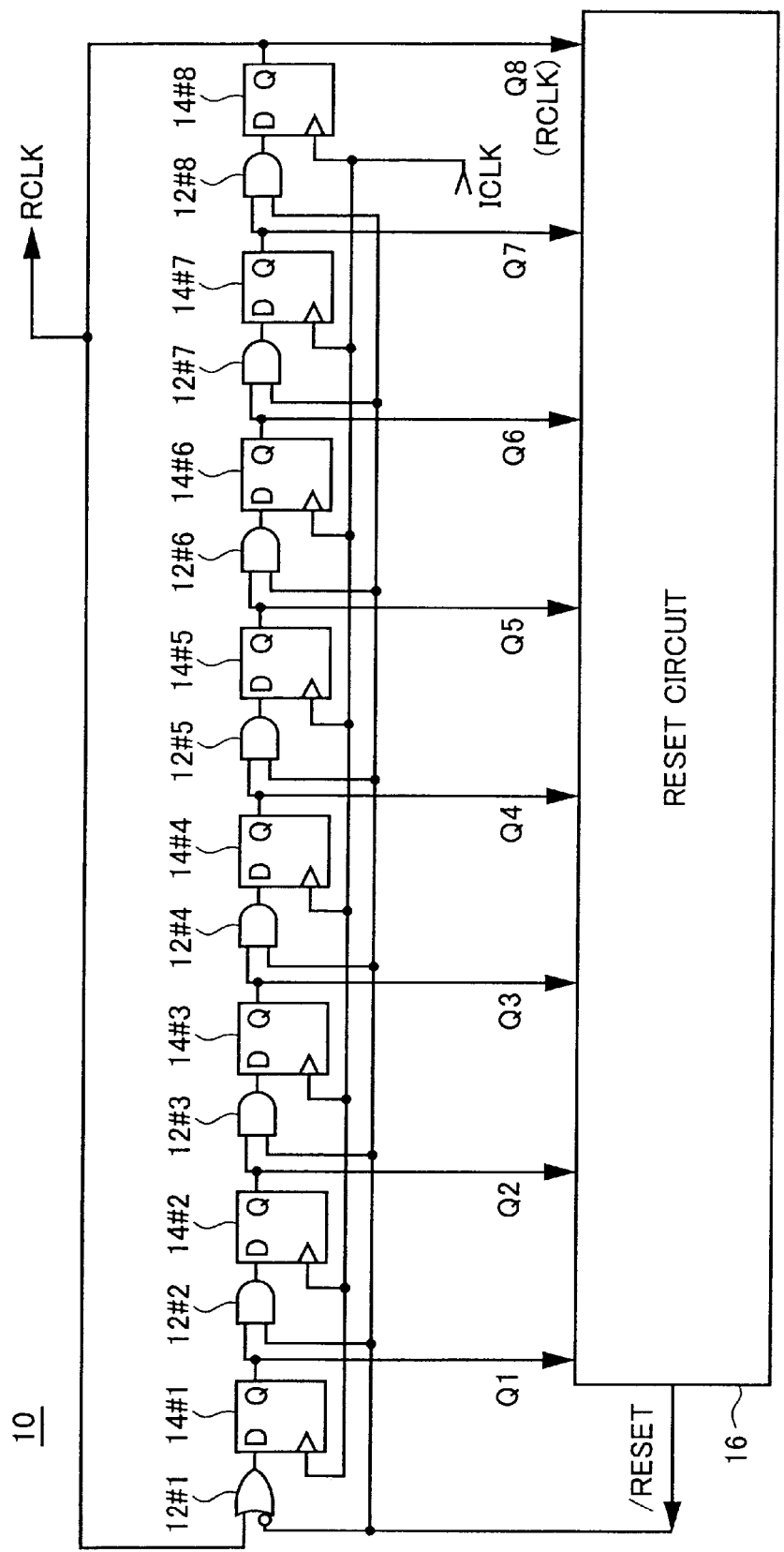
FIG. 3 is a circuit diagram showing a configuration of a ring counter shown in FIG. 1.

FIG. 3 is a circuit diagram showing a configuration of ring counter 10 shown in FIG. 1.

Referring to FIG. 3, ring counter 10 includes a gate circuit 12#1 receiving internal clock signal RCLK and a reset signal /RESET.

Gate circuit 12#1 has its output driven to H level when reset signal /RESET is activated to L level, and also driven to H level when internal clock signal RCLK is set to H level.

Ring counter 10 further includes: a D flip-flop 14#1 receiving an output of gate circuit 12#1 in synchronization with internal clock signal ICLK; an AND circuit 12#2 receiving an output of D flip-flop 14#1 and reset signal /RESET; and a D flip-flop 14#2 receiving an output of AND circuit 12#2 in synchronization with internal clock signal ICLK.

Ring counter 10 further includes: an AND circuit 12#3 receiving an output of D flip-flop 14#2 and reset signal /RESET; a D flip-flop 14#3 receiving an output of AND circuit 12#3 in synchronization with internal clock signal ICLK; an AND circuit 12#4 receiving an output of D flip-flop 14#3 and reset signal /RESET; and a D flip-flop 14#4 receiving an output of AND circuit 12#4 in synchronization with internal clock signal ICLK.

Ring counter 10 further includes: an AND circuit 12#5 receiving an output of D flip-flop 14#4 and reset signal /RESET; a D flip-flop 14#5 receiving an output of AND circuit 12#5 in synchronization with internal clock signal ICLK; an AND circuit 12#6 receiving an output of D flip-flop 14#5 and reset signal /RESET; and a D flip-flop 14#6 receiving an output of AND circuit 12#6 in synchronization with internal clock signal ICLK.

Ring counter 10 further includes: an AND circuit 12#7 receiving an output of D flip-flop 14#6 and reset signal /RESET; a D flip-flop 14#7 receiving an output of AND circuit 12#7 in synchronization with internal clock signal ICLK; an AND circuit 12#8 receiving an output of D flip-flop 14#7 and reset signal /RESET; and a D flip-flop 14#8 receiving an output of AND circuit 12#8 in synchronization with internal clock signal ICLK.

An output of D flip-flop 14#8 is provided to PLL circuit 8 in FIG. 1 as internal clock signal RCLK and compared in phase with clock signal CLK.

Ring counter 10 further includes a reset circuit 16 receiving signals Q1–Q8 to monitor the state of the shift registers and outputting reset signal /RESET when detecting an abnormality.

Figure 4:
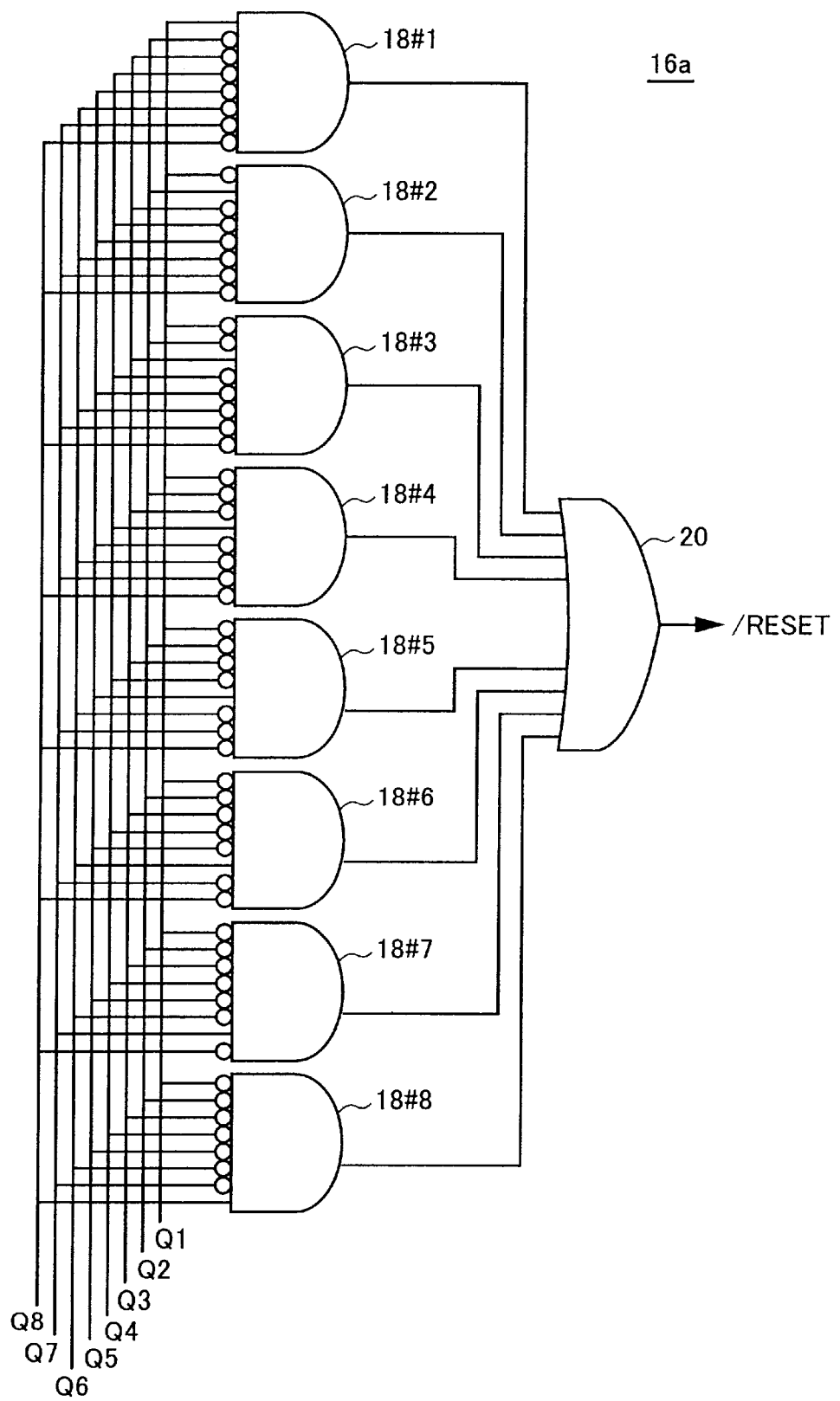
FIG. 4 is a circuit diagram showing a reset circuit 16a which is an example of a reset circuit 16 in FIG. 3.

FIG. 4 is a circuit diagram showing a configuration of a reset circuit 16a which is an example of the reset circuit 16 in FIG. 3.

Referring to FIG. 4, reset circuit 16a includes decode circuits 18#1–18#8 and an OR circuit 20 receiving outputs of decode circuits 18#1–18#8 and outputting reset signal /RESET.

Decode circuit 18#1 outputs H level when it detects that output signal Q1 of D flip-flop 14#1 shown in FIG. 3 is at H level and the output signals of the other D flip-flops are at L level. Decode circuit 18#1 outputs L level when output signals Q1–Q8 are in other combinations.

Decode circuit 18#2 outputs H level when it detects that output signal Q2 of D flip-flop 14#2 shown in FIG. 3 is at H level and the output signals of the other D flip-flops are at L level. Decode circuit 18#2 outputs L level when output signals Q1–Q8 are in other combinations.

Decode circuit 18#3 outputs H level when it detects that output signal Q3 of D flip-flop 14#3 shown in FIG. 3 is at H level and the output signals of the other D flip-flops are at L level. Decode circuit 18#3 outputs L level when output signals Q1–Q8 are in other combinations.

Decode circuit 18#4 outputs H level when it detects that output signal Q4 of D flip-flop 14#4 shown in FIG. 3 is at H level and the output signals of the other D flip-flops are at L level. Decode circuit 18#4 outputs L level when output signals Q1–Q8 are in other combinations.

Decode circuit 18#5 outputs H level when it detects that output signal Q5 of D flip-flop 14#5 shown in FIG. 3 is at H level and the output signals of the other D flip-flops are at L level. Decode circuit 18#5 outputs L level when output signals Q1–Q8 are in other combinations.

Decode circuit 18#6 outputs H level when it detects that output signal Q6 of D flip-flop 14#6 shown in FIG. 3 is at H level and the output signals of the other D flip-flops are at L level. Decode circuit 18#6 outputs L level when output signals Q1–Q8 are in other combinations.

Decode circuit 18#7 outputs H level when it detects that output signal Q7 of D flip-flop 14#7 shown in FIG. 3 is at H level and the output signals of the other D flip-flops are at L level. Decode circuit 18#7 outputs L level when output signals Q1–Q8 are in other combinations.

Decode circuit 18#8 outputs H level when it detects that output signal Q8 of D flip-flop 14#8 shown in FIG. 3 is at H level and the output signals of the other D flip-flops are at L level. Decode circuit 18#8 outputs L level when output signals Q1–Q8 are in other combinations.

When reset circuit 16a has such a configuration, a reset signal is output immediately when an error has occurred, and therefore the normal state can be recovered in synchronization with the rising edge of the next signal. It is noted that each of decode circuits 18#1–18#8 and OR circuit 20 inevitably becomes a complex circuit having many input signals, resulting in large circuit scale, which is not economical.

Figure 5:
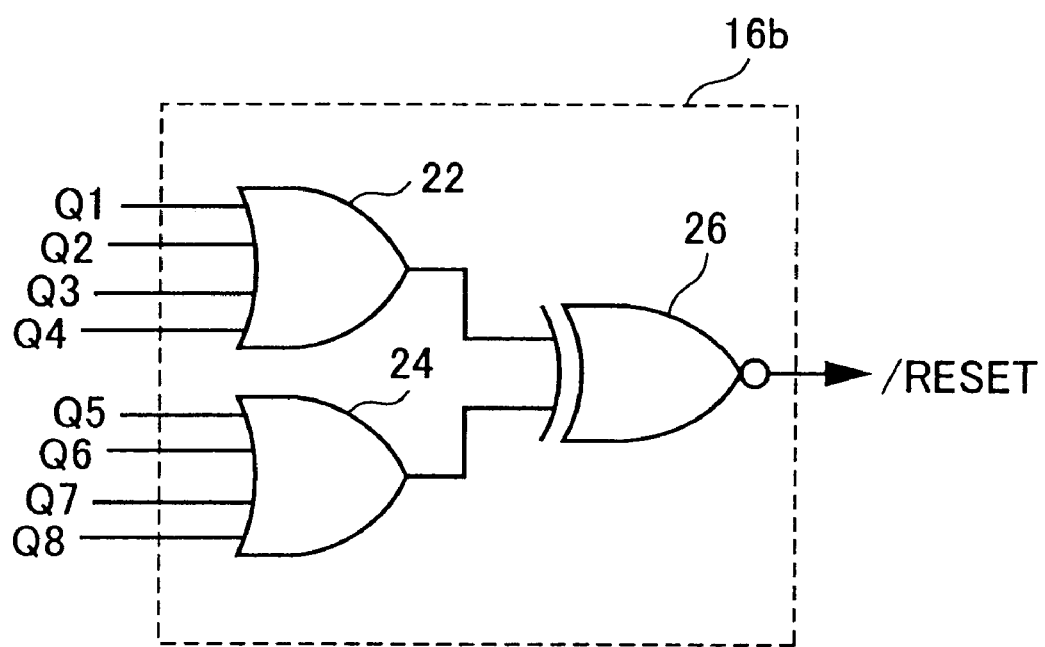
FIG. 5 is a circuit diagram showing a configuration of an improved reset circuit 16b.

FIG. 5 shows a configuration of an improved reset circuit 16b.

Referring to FIG. 5, reset circuit 16b includes: an OR circuit 22 receiving signals Q1–Q4; an OR circuit 24 receiving signals Q5–Q8; and an Exclusive NOR circuit 26 receiving outputs of OR circuits 22 and 24 and outputting reset signal /RESET. The output signal of OR circuit 22 is a reduced signal of signals Q1–Q4, and set to H level when any one of signals Q1–Q4 is at H level. The output signal of OR circuit 24 is a reduced signal of signals Q5–Q8, and set to H level when any one of signals Q5–Q8 is at H level.

Figure 6:
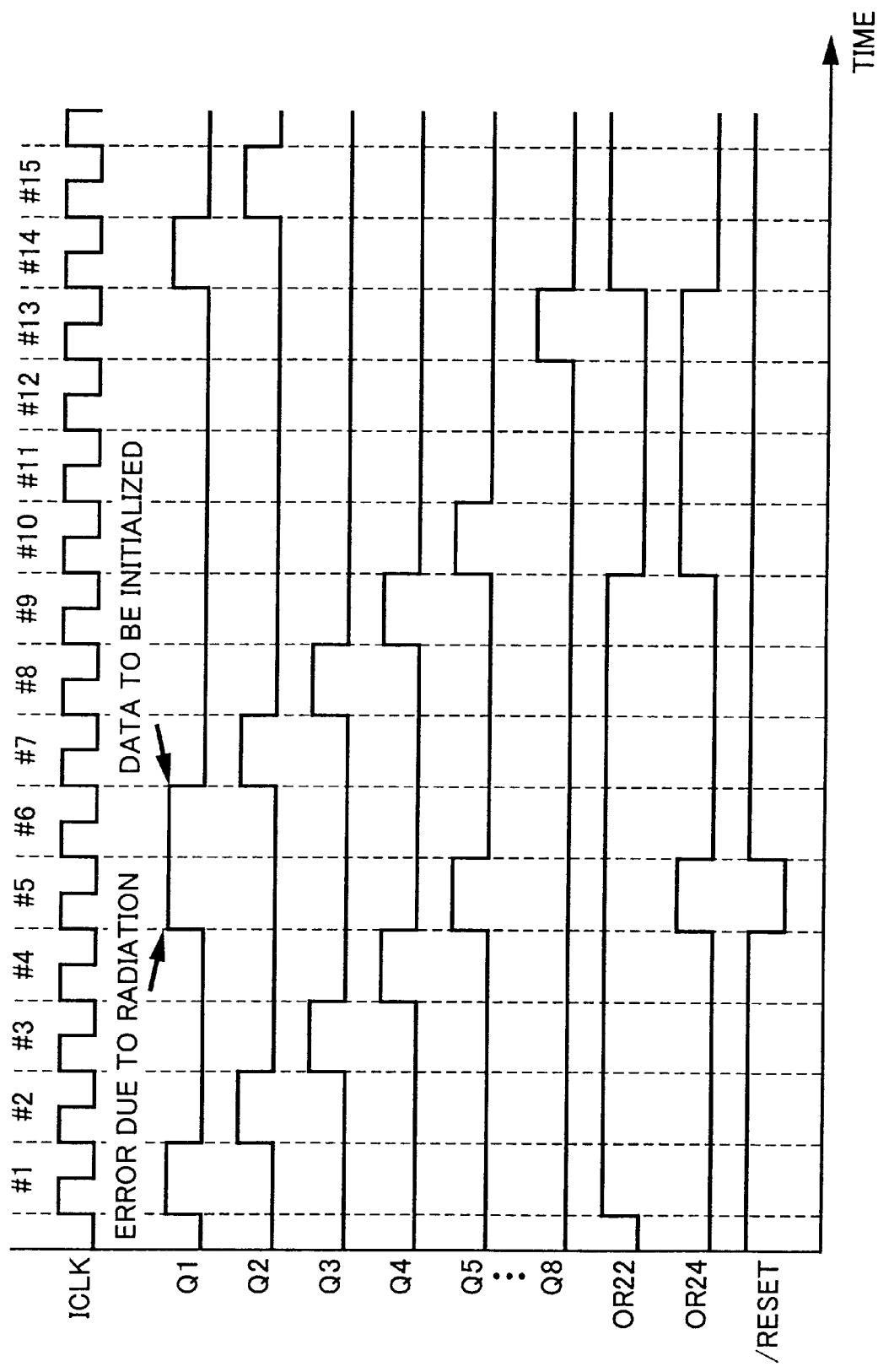
FIG. 6 is an operational waveform diagram illustrating an operation of the reset circuit 16b shown in FIG. 5.

FIG. 6 is a waveform diagram illustrating an operation of reset circuit 16b shown in FIG. 5.

Referring to FIGS. 5 and 6, in clock cycle #1, signal Q1 is at H level while signals Q2–Q8 are at L level. The output of OR circuit 22 receiving signal Q1 of H level is at H level, while the output of OR circuit 24 receiving all L level signals is at L level. Therefore, as the output of OR circuit 22 and the output of OR circuit 24 do not match, reset signal /RESET is at H level.

In clock cycles #2–#4, data is successively shifted each time a clock signal is received, so that the signal to be at H level is also shifting as Q2, Q3, Q4 . . . , in order. Also in this case, as the output of OR circuit 22 is at H level and the output of OR circuit 24 is at L level, reset signal /RESET is at H level.

Now, in clock cycle #5, assuming that at D flip-flop 14#1 an abnormal state is caused by an error, for example due to radiation and that signal Q1 is driven to H level, OR circuit 22 outputs H level, since signal Q1 is at H level and signals Q2–Q4 are at L level.

On the other hand, the original data is transferred to drive signal Q5 to H level. Signals Q6–Q8 are at L level. Therefore, the output of OR circuit 24 is set to H level. Thus, both the output of OR circuit 22 and the output of OR circuit 24 are set to H level. Since the output of OR circuit 22 and the output of OR circuit 24 match, reset signal /RESET is activated to L level.

Then, in the next clock cycle #6, D flip-flops 14#1–14#8 receive data in the initial state, so that signal Q1 is driven to H level and signals Q2–Q8 are driven to L level. Therefore, after clock cycle #6, ring counter 10 can perform a normal operation.

In the waveform diagram shown in FIG. 6 though it is described that L level data is changed to H level by the error due to radiation, it is possible, for example, that signal Q1 which is at H level in clock cycle #1 is caused to L level by the error.

In this case, both the outputs of OR circuit 22 and OR circuit 24 are driven to L level. As Exclusive NOR circuit can detect this state as well, the abnormality is detected and ring counter is reset.

Further, it may be possible to provide a circuit that outputs a reset signal every eight cycles, as a reset circuit. Reset circuit 16b, however, may recover to the normal state more quickly, since it can recover to the normal state at most three clocks after an error has occurred.

As explained above, the semiconductor device described with respect to the first embodiment may enable to recover to the normal state quickly even when an error occurs, so that the operational reliability of a semiconductor device can be enhanced.

Second Embodiment

Figure 7:
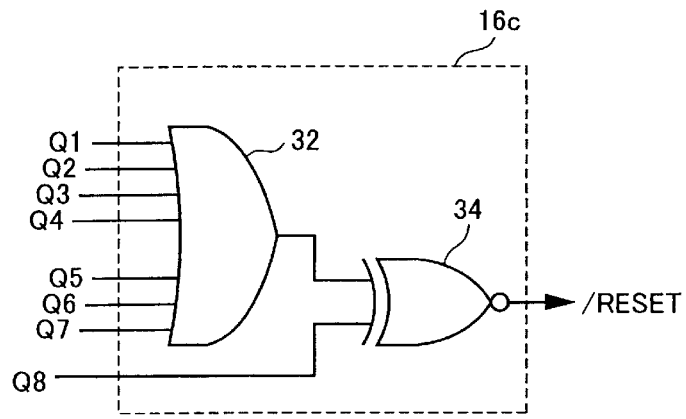
FIG. 7 is a circuit diagram showing a configuration of a reset circuit 16c used in a semiconductor of a second embodiment.
Figure 8:
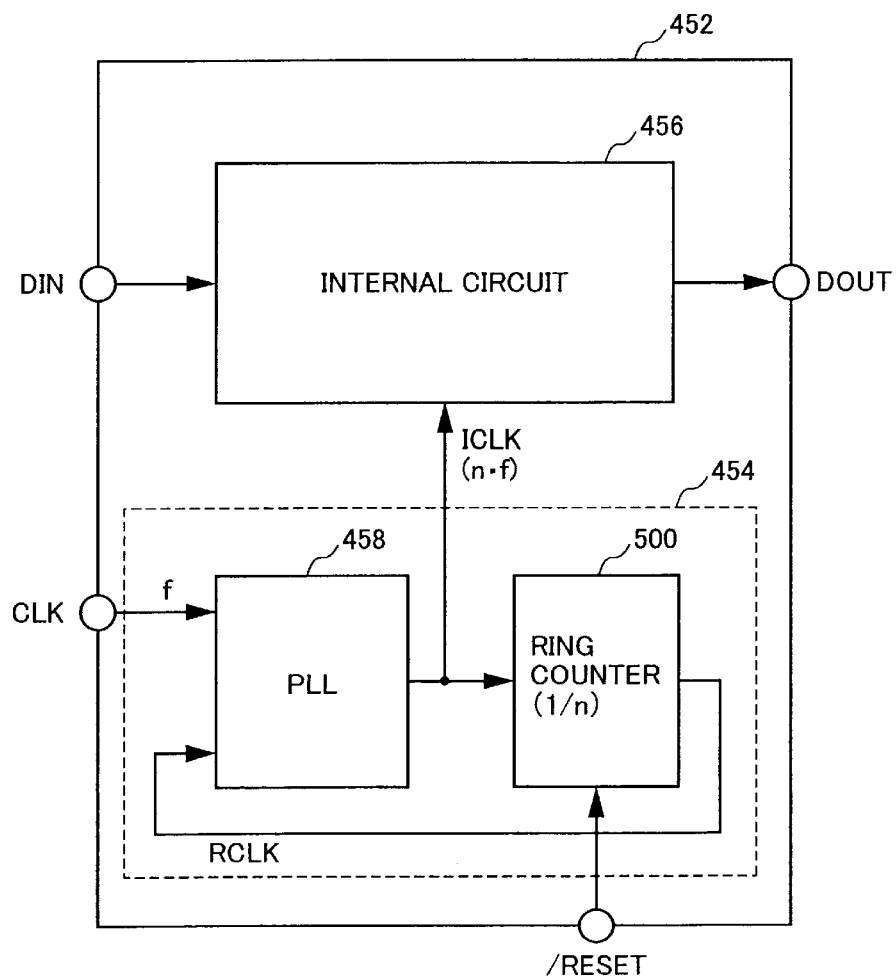
FIG. 8 is a block diagram showing a schematic configuration of a conventional semiconductor device 452.
Figure 9:
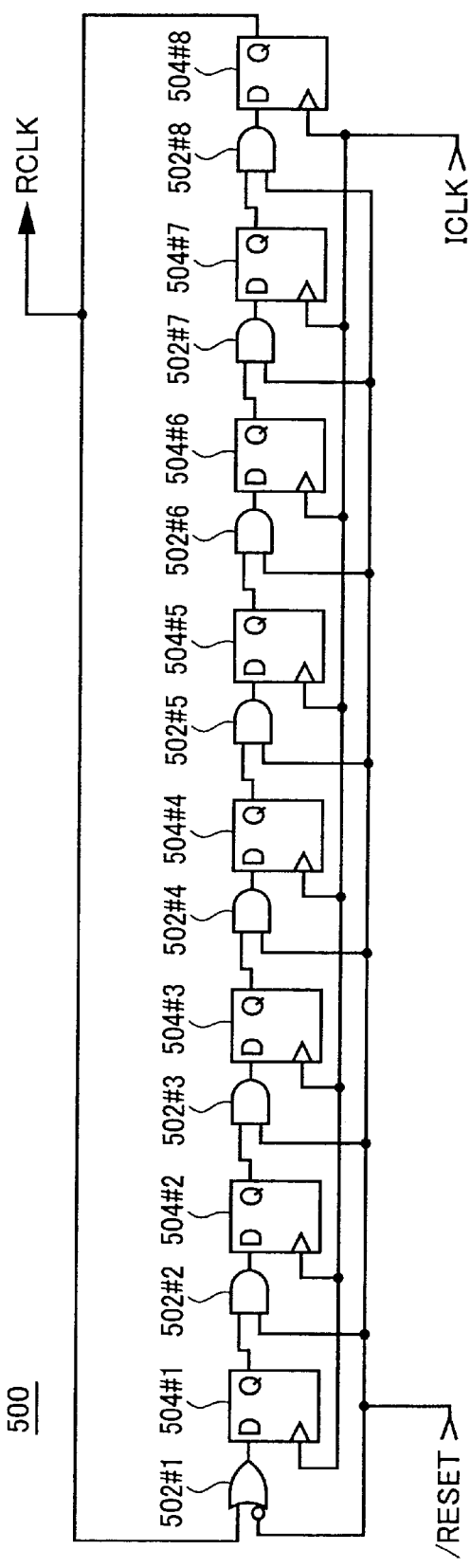
FIG. 9 is a circuit diagram showing a configuration of the ring counter 500 shown in FIG. 8.
Figure 10:
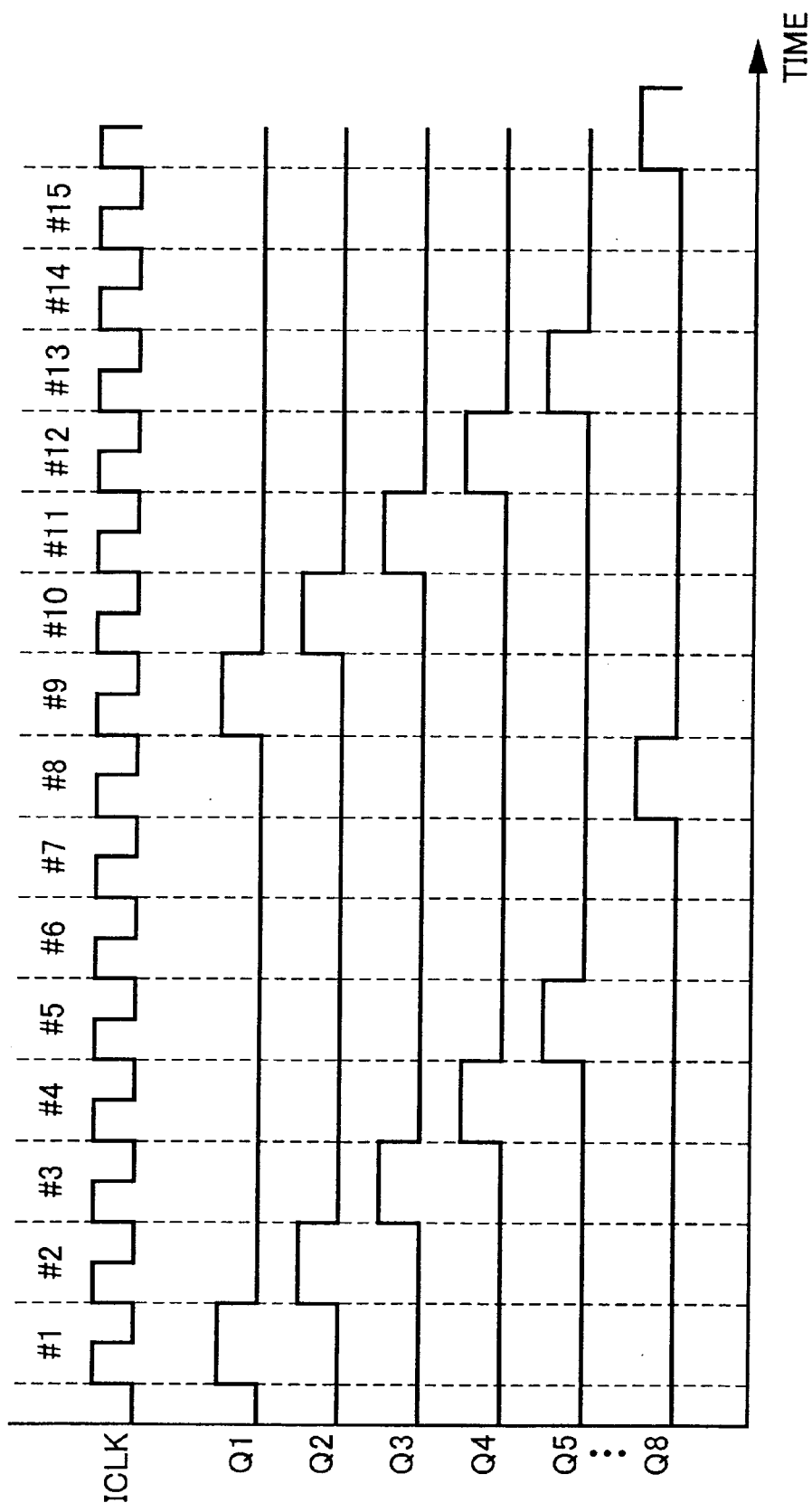
FIG. 10 is an operational waveform diagram illustrating the ring counter 500 shown in FIG. 9.
Figure 11:
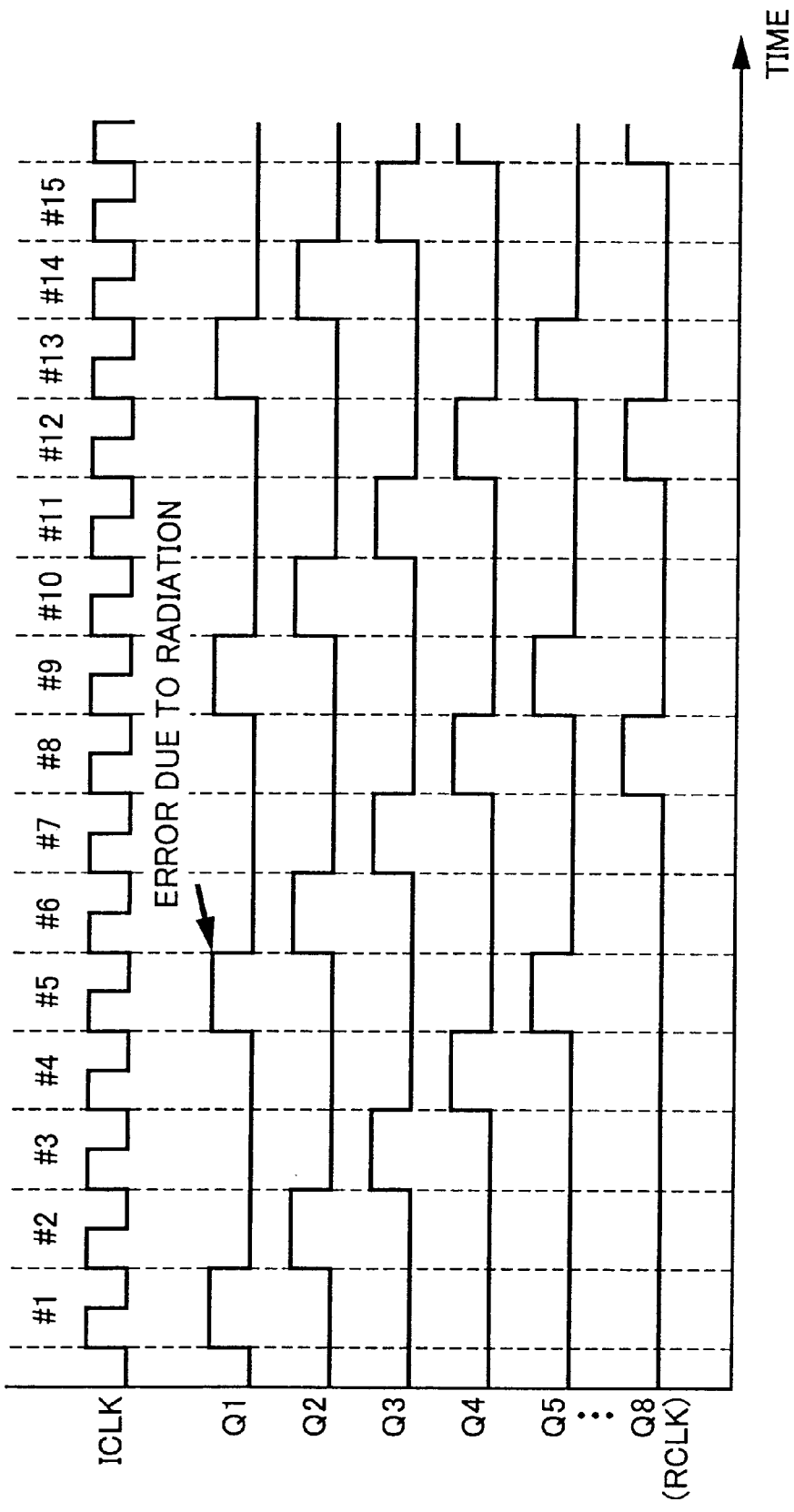
FIG. 11 is a waveform diagram illustrating an error of the conventional ring counter.

FIG. 7 is a circuit diagram showing a configuration of a reset circuit 16c for use in a semiconductor device in accordance with the second embodiment.

Referring to FIG. 7, reset circuit 16c includes an OR circuit 32 receiving signals Q1–Q7 and an Exclusive NOR circuit 34 receiving an output of OR circuit 32 and signal Q8. An output signal of OR circuit 32 is a reduced signal of signals Q1–Q7 and set to H level when any one of signals Q1–Q7 is at H level. Exclusive NOR circuit 34 outputs reset signal /RESET.

More specifically, in the configuration of reset circuit 16b shown in FIG. 5, the outputs of the flip-flops are divided into four outputs and four outputs which are received by OR circuits 22 and 24, respectively. Then Exclusive NOR circuit 26 checks whether the outputs of OR circuits 22 and 24 match. The outputs of the flip-flops, however, are not necessarily divided into four outputs and four outputs which are received by OR circuits, respectively.

More specifically, the outputs may be divided into seven outputs and one output, as shown in FIG. 7. Alternatively, the outputs may be divided into three outputs and five outputs or two outputs and six outputs. Any configuration may be employed provided that all the outputs of the flip-flops are divided into two groups to monitor the results.

As explained above, the semiconductor described with respect to the second embodiment can also recover to the normal state immediately at the time of the abnormality, and therefore the operational reliability can be enhanced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a plurality of holding circuits connected in series in a ring, each receiving data in synchronization with a clock signal and transmitting the data to a next stage; and
   a reset circuit monitoring hold data in said plurality of holding circuits and when detecting an abnormal state of said plurality of holding circuits, initializing said hold data;
   said abnormal state including
      a first state in which data of a first logical value exists in a first portion of said plurality of holding circuits and data of said first logical value exists in a second portion excluding said first portion of said plurality of holding circuits, and
      a second state in which data of said first logical value does not exist in said plurality of holding circuits.

2. The semiconductor device according to claim 1, wherein
   said reset circuit includes
   a first reducing circuit reducing data in said first portion,
   a second reducing circuit reducing data in said second portion, and
   a match detecting circuit outputting a reset signal for initializing said plurality of holding circuits when outputs of said first reducing circuit and said second reducing circuit match.

3. The semiconductor device according to claim 2, wherein
   said first logical value is one,
   said first reducing circuit has an OR circuit receiving a first input signal corresponding to hold data in said first portion,
   said second reducing circuit has a second OR circuit receiving a second input signal corresponding to hold data in said second portion, and
   said match detecting circuit has an Exclusive NOR circuit outputting said reset signal when outputs of said first and second OR circuits match.

4. The semiconductor device according to claim 1, wherein
   said second portion includes a first holding circuit,
   said first portion includes remaining holding circuits excluding said first holding circuit out of said plurality of holding circuits, and
   said reset circuit includes
      a reducing circuit reducing hold data in said first portion, and
      a match detecting circuit outputting a reset signal for initializing said plurality of holding circuits when an output of said reducing circuit and an output of said first holding circuit match.

5. The semiconductor device according to claim 4, wherein
   said first logical value is one,
   said reducing circuit has an OR circuit receiving input signals corresponding to hold data in said first portion, and
   said match detecting circuit has an Exclusive NOR circuit outputting said reset signal when an output of said OR circuit and an output of said first holding circuit match.

6. The semiconductor device according to claim 1, wherein
   said plurality of holding circuit includes
      a first holding circuit initialized to said first logical value in response to an output of said reset circuit, and
      a second holding circuit initialized to a second logical value complementary to said first logical value in response to the output of said reset circuit.

7. The semiconductor device according to claim 1, further comprising:
   a clock generating circuit outputting said clock signal having a frequency higher than that of an external clock signal in response to any one of outputs of said plurality of holding circuits and said external clock signal; and
   an internal circuit performing an operation in synchronization with said clock signal.

8. A semiconductor device, comprising:
   a plurality of holding circuits connected in series in a ring, each receiving data in synchronization with a clock signal and transmitting the data to a next stage; and
   a reset circuit monitoring hold data in said plurality of holding circuits and initializing said hold data when detecting an abnormality;
   said reset circuit including
      a plurality of decode circuits respectively detecting a plurality states in which said plurality of holding circuits can be in a normal operational state, and
      an output circuit outputting a reset signal for initializing said hold data when none of outputs of said plurality of decode circuits are activated.

9. The semiconductor device according to claim 8, further comprising:
   a clock generating circuit outputting said clock signal having a frequency higher than that of an external clock signal in response to any one of outputs of said plurality of holding circuits and said external clock signal; and
   an internal circuit performing an operation in synchronization with said clock signal.

* * * * *